(12) United States Patent
Otani

(10) Patent No.: US 7,989,947 B2
(45) Date of Patent: Aug. 2, 2011

(54) SEMICONDUCTOR DEVICE AND METHOD OF MANUFACTURING THE SAME

(75) Inventor: Katsumi Otani, Osaka (JP)

(73) Assignee: Panasonic Corporation, Osaka (JP)

( * ) Notice: Subject to any disclaimer, the term of this patent is extended or adjusted under 35 U.S.C. 154(b) by 155 days.

(21) Appl. No.: 12/041,793

(22) Filed: Mar. 4, 2008

(65) Prior Publication Data

US 2008/0217753 A1    Sep. 11, 2008

(30) Foreign Application Priority Data

Mar. 6, 2007   (JP) ................. 2007-054959
Jun. 4, 2007   (JP) ................. 2007-147571

(51) Int. Cl.
*H01L 23/34* (2006.01)

(52) U.S. Cl. . 257/706; 257/796; 257/712; 257/E23.102; 257/713; 438/124

(58) Field of Classification Search ................. 257/706, 257/712, 713, E23.102, 796, 434, 680; 438/122, 438/124, 126

See application file for complete search history.

(56) References Cited

U.S. PATENT DOCUMENTS

| | | | | |
|---|---|---|---|---|
| 5,982,621 | A * | 11/1999 | Li ................................. | 361/704 |
| 6,486,564 | B2 * | 11/2002 | Liu et al. ....................... | 257/796 |
| 6,969,640 | B1 * | 11/2005 | Dimaano, Jr. et al. ........ | 438/122 |
| 7,190,067 | B2 * | 3/2007 | Chen et al. .................... | 257/706 |
| 2005/0104164 | A1 | 5/2005 | Awujoola et al. ............. | 257/659 |
| 2005/0285258 | A1 | 12/2005 | Chen et al. .................... | 257/706 |
| 2007/0200225 | A1 * | 8/2007 | Ibrahim et al. ................ | 257/712 |
| 2008/0079144 | A1 * | 4/2008 | Tang et al. .................... | 257/706 |

FOREIGN PATENT DOCUMENTS

JP    8-139223    5/1996

* cited by examiner

*Primary Examiner* — Matthew C Landau
*Assistant Examiner* — Jessica Hall
(74) *Attorney, Agent, or Firm* — Steptoe & Johnson LLP

(57) ABSTRACT

A semiconductor device includes a semiconductor element 1, a thermal conductor 91 located opposite a major surface of the semiconductor element 1, and a mold resin member 6 molding the semiconductor element 1 and at least a part of the thermal conductor 91, wherein at least a part of a top surface of the thermal conductor 91 has an exposed portion exposed from the mold resin member 6, the exposed portion of the thermal conductor 91 has an opening 11, and a periphery of the opening 11 forms a projecting portion 91*b* projecting toward an opposite side of the semiconductor element 1.

20 Claims, 13 Drawing Sheets

SEMICONDUCTOR DEVICE AND METHOD OF MANUFACTURING THE SAME

FIELD OF THE INVENTION

The present invention relates to a semiconductor device in which a semiconductor element generating a large quality of heat is suitably mounted, and a method of manufacturing the semiconductor device.

BACKGROUND OF THE INVENTION

Owing to the multiple functions and reduced size and thickness of recent electronic apparatuses, the size and thickness of semiconductor devices have been increasingly reduced, and the number of terminals on the semiconductor devices tends to increase. One known type of semiconductor device appropriate for this situation is what is called a BGA (Ball Grid Array) package from which laterally projecting external leads as used in a conventional QFP (Quad Flat Package) are omitted but which has solder balls arranged on a bottom surface of the semiconductor device in a matrix as external electrodes for electric connections, or an LGA (Land Grid Array) package having external electrodes arranged in a matrix, or a QFN (Quad Flat Non-lead) package having external electrodes arranged on the bottom surface of the semiconductor device peripherally to one another.

If a semiconductor element generating a large quantity of heat is mounted in such a resin molding (BGA, LGA, QFN, or the like) semiconductor device, the semiconductor device needs to be designed with the radiation property thereof taken into account. Japanese Patent Laid-Open No. 8-139223 discloses a semiconductor device having a structure shown below.

Now, the conventional semiconductor device disclosed in Japanese Patent Laid-Open No. 8-139223 will be described with reference to relevant drawings.

FIG. 12 is a sectional view of the conventional semiconductor device. FIG. 13 is a perspective view of a thermal conductor in the semiconductor device in FIG. 12.

As shown in FIGS. 12 and 13, the conventional semiconductor device 100 is made up of an insulating resin and composed of a substrate 3 having wiring patterns 2 formed on opposite surfaces thereof and electrically connected together via via holes 7, a semiconductor element 1 mounted on a major surface (semiconductor element mounting surface) of the substrate 3 via an adhesive 4, thin metal wires 5 electrically connecting the semiconductor element 1 to the wiring patterns 2 on the substrate 3, ball electrodes 8 arranged in a matrix on a surface of the substrate 3 which is opposite the semiconductor element 1 mounting surface, the ball electrodes 8 being electrically connected to the wiring patterns 2 on the substrate 3, and a thermal conductor 9 which covers the semiconductor element 1 mounting surface side of the substrate 3 and the semiconductor element 1, all or a part of a top surface of the thermal conductor 9 being exposed from a mold resin member 6 to the exterior. The thermal conductor 9 may be placed in abutment with the substrate 3 and secured thereto with an adhesive (not shown) or the like or may be disposed in abutment with the substrate 3 without being secured thereto.

The thermal conductor 9 is made up of a material with a high thermal conductance such as Cu, Cu alloy, Al, Al alloy, or Fe—Ni alloy The thermal conductor 9 has a plurality of openings 10 formed in an inclined portion 9a located close to an outer periphery thereof.

In the configuration of the semiconductor device 100, heat generated by the semiconductor element 1 is dissipated through the via holes 7 and the ball electrodes 8 and also from the major surface (the top surface in FIG. 12) of the semiconductor element 1 via the thermal conductor 9. The semiconductor device 100 thus exhibits an excellent radiation property.

Furthermore, by providing, for example, a heat sink (not shown), on the top surface of the portion of the thermal conductor 9 exposed from the molding resin member 6, it is possible to further enhance the effect of heat radiation from the major surface of the semiconductor element 1.

Moreover, since the plurality of openings 10 are formed in the inclined portion 9a of the thermal conductor 9, resin can be easily injected into the gap between the thermal conductor 9 and the semiconductor element 1 in the case of resin molding. A resin injecting capability is thus improved.

Now, description will be given of a conventional method of manufacturing a semiconductor device.

As shown in FIG. 14A, the substrate 3 with the wiring patterns 2 formed on the both surfaces is provided. As shown in FIG. 14B, the semiconductor element 1 is fixed and mounted on a top surface of the substrate 3 at bonding positions with an adhesive 4.

Then, as shown in FIG. 14C, electrode pads (not shown) on the semiconductor element 1 mounted on the substrate 3 are electrically connected, by the thin metal wires 5, to the wiring patterns 2, provided on the top surface of the substrate 3.

Then, as shown in FIG. 14D, the thermal conductor 9 is brought into abutment with the substrate 3 so as to cover the semiconductor element 1. The thermal conductor 9 and the substrate 3 may be secured to each other at the abutting portion with the adhesive (not shown) or the like or only brought into abutment with each other without being secured to each other. Here, the thermal conductor 9 is obtained by subjecting a substantially rectangular plate to drawing or the like and providing a prismatic portion in the center of the plate such that the top of the prismatic portion is exposed from the mold resin member 6 and shaped like a cap covering the whole semiconductor element 1 as shown in FIGS. 12 and 13. The openings 10 are formed in the inclined portion 9a close to the outer periphery of the thermal conductor 9.

Then, as shown in FIG. 14E, the semiconductor element 1 is mounted on and electrically connected to the substrate 3 via the thin metal wires 5. The substrate 3 against which the thermal conductor 9 abuts is set on a lower die 21A of a molding die 21 and molded by an upper die 21B of the molding die 21. At this time, a bottom surface of the upper die 21B of the molding die 21 contacts the top surface of the thermal conductor 9. In this condition, the mold resin member 6 is injected through an injection gate 21 in an injection direction 22s; the injection gate 21 is formed in the upper die 21B of the molding die 21 in a horizontal direction. As a result, the gap on the top surface of the substrate 3 is covered with the mold resin member 6, whereas the top surface of the thermal conductor 9 is exposed from the mold resin member 6 to the exterior. Then, after the molding resin 6 is cured, the upper die 21B and lower die 21A of the molding die 21 are opened.

Then, as shown in FIG. 14F, the substrate 3 with the top surface thereof molded by the mold resin member 6 is cut into semiconductor chips using a rotating blade (not shown).

Finally, the solder balls are attached to the external pad electrodes on a bottom surface of the substrate 3 to form the ball electrodes 8, which constitute external terminals. The semiconductor device 100 as shown in FIG. 12 can thus be manufactured.

The conventional semiconductor device 100 ensures the radiation property because the top surface of the thermal conductor 9 is exposed from the mold resin member 6. However, in the process of resin molding, owing to the use of a scheme (hereinafter referred to as a side gate scheme) according to which the resin is injected through the injection gate 21s, formed in a side surface of the semiconductor device 100, the thin metal wires S may be deformed as shown in FIG. 15C.

FIG. 15A is a sectional view of the side gate scheme showing a state immediately before resin molding; the sectional view is taken along an alternate long and short dash line A-A shown in FIGS. 15B and 15C. FIG. 15B is a plan view showing the shape of the thin metal wires 5 observed before resin injection. FIG. 15C is a plan view showing the shape of the thin metal wires 5 and the flow pattern of the resin observed after the resin injection.

As shown in FIG. 15C, the resin injected through the injection gate 21s in the injection direction 22s is injected so as to create ripples around the injection gate 21s. Here, dotted lines 6a each show a position reached by the resin at the same time.

The amount by which the thin metal wire 5 is deformed is proportional to the "viscosity of the resin", the "flow speed of the resin", the "angle of leading end of the resin flow to the thin metal wire", and the like. As shown in FIG. 15B, the thin metal wires 5 extend radially from the center of the major surface of the semiconductor element 1. Thus, as shown in FIG. 15C, after the resin injection is completed, the thin metal wires 5 located close to the injection gate 21s or at a very small angle to the leading end of the flow located opposite the injection gate are not substantially deformed. However, the other thin metal wires 5 are deformed according to "the flow speed of the resin", the "angle of leading end of the resin flow to the thin metal wire", and the like.

Therefore, for the semiconductor device with the thin metal wires 5 densely arranged as a result of the reduced size of the device and the increased number of terminals, the resin molding based on the conventional side gate scheme may disadvantageously cause the adjacent thin metal wires 5 with a short distance therebetween to be deformed and short-circuited.

To prevent the planar deformation of the thin metal wires 5, a scheme (hereinafter referred to as a top gate scheme) may be adopted according to which the resin is injected through an injection gate 21t formed so as to open in the top surface of the semiconductor device, as shown in FIG. 16A to 16C.

FIG. 16A is a sectional view of the top gate scheme; the sectional view is taken along alternate long and short dash line B-B shown in FIGS. 16B and 16C. FIG. 16B is a plan view showing the shape of the thin metal wires 5 observed before the resin injection. FIG. 16C is a plan view showing the shape of the thin metal wires 5 and the injection pattern of the resin observed after the resin injection.

As shown in FIG. 16C, the resin injected through the injection gate 21t in an injection direction 22t is injected so as to create ripples around the injection gate 21t. Here, the dotted lines 6a each show the position reached by the resin at the same time.

When the injection gate 21t is located above the center of the semiconductor element 1, all the thin metal wires 5 extending radially from the center of the semiconductor element 1 are located at a very small angle from the leading end of the flow. This prevents the thin metal wires 5 from being deformed, enabling high-quality semiconductor devices to be manufactured.

However, in the conventional semiconductor device 100, the thermal conductor 9 covers the entire top surface of the semiconductor element 1 and is exposed from the mold resin member 6 to the exterior This makes it difficult to locate the injection gate of the resin above the semiconductor element 1, preventing the adoption of the top gate scheme.

Furthermore, in the conventional semiconductor device 100, since the thermal conductor 9 is located to cover the entire surface of the semiconductor element 1, the thermal conductor 9 may obstruct the resin molding in spite of the presence of the openings 10. This may disadvantageously prevent the resin from being completely filled into the mold.

DISCLOSURE OF THE INVENTION

The present invention is made in view of the above-described circumstances. An object of the present invention is to provide a semiconductor device with a stable quality which can be manufactured while preventing short-circuiting of thin metal wires and incomplete filling of resin during a manufacturing process and which exhibits an excellent radiation property and is free from thin burrs, as well as a method of manufacturing the semiconductor device.

To accomplish the object, the present invention provides a semiconductor device including a semiconductor element, a thermal conductor located opposite a major surface of the semiconductor element, and a mold resin member molding the semiconductor element and at least a part of the thermal conductor, wherein at least a part of a top surface of the thermal conductor has an exposed position exposed from the mold resin member, the exposed portion of the thermal conductor has an opening, and a periphery of the opening forms a projecting portion projecting toward an opposite side of the semiconductor element.

Furthermore, the semiconductor device further includes a substrate having a plurality of electrode terminals on a bottom surface, and the thermal conductor is located opposite the major surface of the semiconductor element fixed to a top surface of the substrate.

Furthermore, the semiconductor device further includes a die pad and a plurality of leads arranged around a periphery of the die pad and each having a bottom surface forming an external terminal and a top surface forming an internal terminal, and the thermal conductor is located opposite the major surface of the semiconductor element fixed on the die pad.

Furthermore, the projecting portion of the thermal conductor is formed integrally with the other portions of the thermal conductor.

Furthermore, a part of the projecting portion of the thermal conductor is flush with a plane substantially parallel to the other exposed portion of the thermal conductor.

Furthermore, the thermal conductor is supported by a support portion fixed on the substrate.

Furthermore, the thermal conductor is supported by a support portion fixed on a hanging lead connected to the die pad.

Furthermore, the support portion is formed by bending a part of the thermal conductor.

Furthermore, the support portion is formed by bending a part of the thermal conductor.

Furthermore, a part of the thermal conductor which is buried in the mold resin member has a roughened surface.

Furthermore, the semiconductor device further includes a plurality of thin metal wires electrically connecting the substrate and the semiconductor element together.

Furthermore, the semiconductor device further includes a plurality of thin metal wires electrically connecting the lead and the semiconductor element together.

Furthermore, the thermal conductor is connected to a ground terminal.

The present invention also provides a method of manufacturing a semiconductor device, the method including the steps of: providing a thermal conductor having an opening and a projecting portion provided around a periphery of the opening and projecting upward from a top surface of the thermal conductor, mounting the thermal conductor so that a surface of the thermal conductor which is opposite a surface thereof from which the projecting portion projects is located opposite a major surface of a semiconductor element, installing a molding die so that the projecting portion abuts against an inner wall of the molding die, and injecting resin into the molding die through an injection port formed in the molding die and through the opening to mold the semiconductor element and the thermal conductor so as to expose the projecting portion.

Furthermore, the opening in the thermal conductor is formed so as to have a diameter larger than a diameter of the injection port in the molding die, and during resin injection, a circumference of the projecting portion formed around the periphery of the opening in the thermal conductor entirely contacts an inner wall portion of the molding die which is located outside a periphery of the injection port.

Furthermore, in the step of manufacturing the thermal conductor, a cylindrical mold having a tip portion smaller than the opening in the thermal conductor and a root portion larger than the opening is inserted into the opening in the thermal conductor to bend the periphery of the opening in the thermal conductor to form the projecting portion.

Furthermore, in the step of manufacturing the thermal conductor, the projecting portion is formed around the periphery of the opening in the thermal conductor by using a first die to support the periphery of the opening in the thermal conductor, using a second die to support a part of the thermal conductor which is located outside the periphery of the opening, and moving the second die along a thickness direction of the thermal conductor relative to the first die.

Furthermore, in the step of manufacturing the thermal conductor, the projecting portion is formed, and the opening is then formed in a center of the projecting portion.

Furthermore, in the step of manufacturing the thermal conductor, the projecting portion is formed by pressing using a mold projecting the periphery of the opening in the thermal conductor.

Furthermore, in the step of manufacturing the thermal conductor, the projecting portion is formed by pressing using the mold projecting the center of the thermal conductor, and the opening is then formed in the center of the projecting portion.

Description will be given of effects of the semiconductor device and the method of manufacturing the semiconductor device according to the present invention. The semiconductor device, on which the semiconductor element generating a large quantity of heat is mounted, has the thermal conductor exposed to the exterior. This enhances the radiation property of the semiconductor device. Furthermore, the opening is formed in the thermal conductor exposed from the mold resin member to the exterior. This enables resin injection to be stably achieved so as to enable resin molding according to the top gate scheme without suffering short-circuiting of the thin metal wires in the semiconductor device and incomplete filling of the resin. The quality of the semiconductor device can thus be stabilized.

Moreover, the projecting portion is provided around the periphery of the opening. Thus, when the molding die is clamped for resin molding, the projecting portion abuts against the inner wall portion of the molding die under an appropriate contact pressure, and during the resin molding, the molding resin advances between the periphery of the opening in the thermal conductor and the inner wall surface of the molding die. This makes it possible to reliably prevent possible thin burrs to enable the resin injection to be stably achieved. The semiconductor device with a stable quality can thus be obtained.

Furthermore, the support portion is provided only in the part of the thermal conductor. This improves the fluidity of the resin, making it possible to prevent the possible incomplete filling of the resin.

BRIEF DESCRIPTION OF THE DRAWINGS

FIGS. 15A to 15C are diagrams illustrating the mechanism of deformation of thin metal wires based on a side gate scheme, wherein FIG. 15A is a front sectional view and FIGS. 15B and 15C are plan views; and FIGS. 16A to 16C are diagrams illustrating the mechanism of deformation of the thin metal wires based on a top gate scheme, wherein FIG. 16A is a front sectional view and FIGS. 16B and 16C are plan views.

DESCRIPTION OF THE EMBODIMENTS

Figure 1:
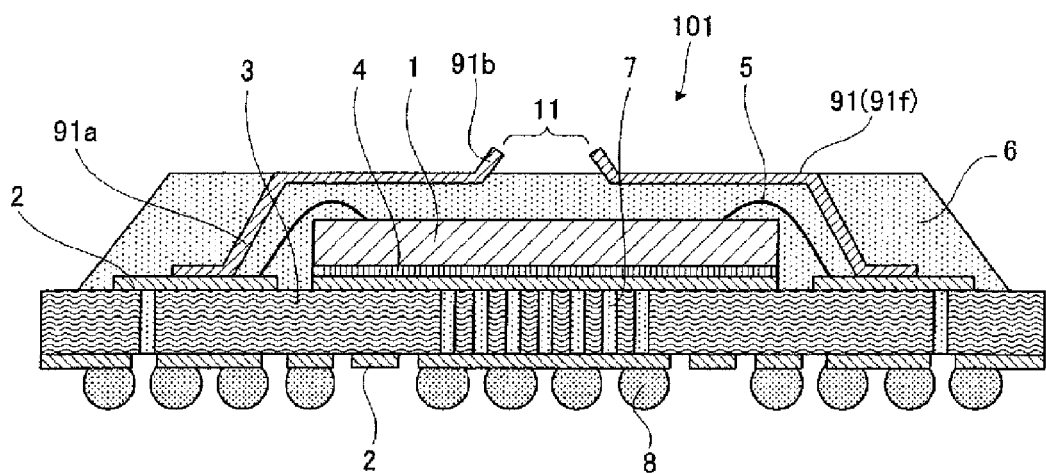
FIG. 1 is a sectional view of a semiconductor device according to a first embodiment of the present invention.

With reference to the drawings, description will be given of semiconductor devices 101, 102, and 103 according to embodiments of the present invention. For easy understanding, in the description below, a surface of a substrate on which a semiconductor element is mounted corresponds to a top surface. Components of the semiconductor devices which have substantially the same functions as the conventional semiconductor device 100 are denoted by the same reference numerals.

First Embodiment

FIG. 1 shows a sectional view of the semiconductor device 101 according to a first embodiment of the present invention.

As shown in FIG. 1, the semiconductor device 101 according to the present embodiment comprises a substrate 3 made up of an insulating resin and having wiring patterns 2 formed on both surfaces thereof and electrically connected together via holes 7, a semiconductor element 1 having a plurality of electrodes (not shown) on each of a bottom surface and a top surface thereof and mounted on a top surface of the substrate 3 via an adhesive 4, the top surface of the substrate corresponding to a major surface (this is also hereinafter referred to a semiconductor element mounting surface), thin metal wires 5 electrically connecting the semiconductor element 1 and the wiring patterns 2 on the substrate 3 together, ball electrodes 8 arranged in a matrix on a bottom surface of the substrate 3 which is opposite the semiconductor element mounting surface, the ball electrodes 8 being electrically connected to the wiring patterns 2 on the substrate 3, a thermal conductor 91 located over the semiconductor element mounting surface of the substrate 3 and opposite the major surface (the circuit surface or top surface of the semiconductor element 1) of the semiconductor element 1 and appearing to have a substantially trapezoidal cross section in a side view, and a mold resin member 6 that molds a part of each of the semiconductor element mounting surface of the substrate 3, the semiconductor element 1, and the thermal conductor 91.

Figure 2:
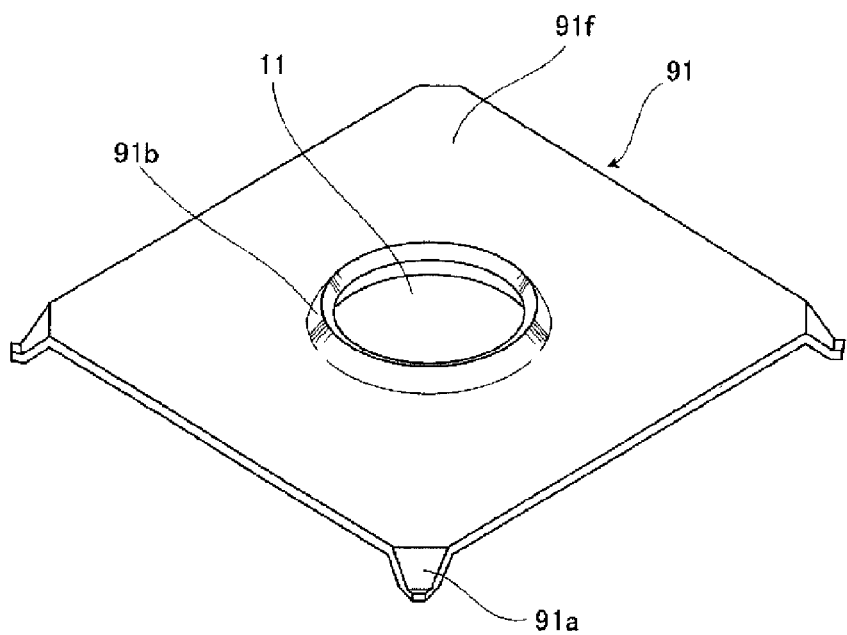
FIG. 2 is a perspective view of a thermal conductor in the semiconductor device according to the first embodiment.

In particular, in the semiconductor device 101 according to the present embodiment, as shown in FIGS. 1 and 2, a surface of the thermal conductor 91 which is opposite a surface thereof located opposite the major surface of the semiconductor element 1, that is, a top surface of the thermal conductor 91, constitutes an exposed portion 91f exposed from the mold resin member 6 to the exterior. An opening 11 is formed in a part of the exposed portion 91f of the thermal conductor 91, which portion is exposed to the exterior, so as to penetrate the thermal conductor 91 in a board thickness direction. Moreover, a projecting portion 91b is provided around the periphery of the opening 11 so as to project toward the opposite side of an area in which the semiconductor element 1 is disposed, that is, from the exposed portion 91f toward the opposite side of the surface of the thermal conductor which is opposite the major surface of the semiconductor element 1 (in a direction in which the projecting portion 91b leaves the semiconductor element 1 (the direction in which the exposed portion 91f is more significantly exposed; upward in FIG. 1) and which is opposite to a direction in which the projecting portion 91b approaches the semiconductor element 1).

As shown in FIGS. 1 and 2, the opening 11 is formed in the thermal conductor 91 so as to lie vertically above the center of the major surface of the semiconductor element 1, which is substantially parallel to the top surface of the thermal conductor 91 (that is, in a plan view, the opening 11 in the thermal conductor 91 appears to overlap the center of the major surface of the semiconductor element 1). The projecting portion 91b, provided around the periphery of the opening in the thermal conductor 91 is shaped substantially like a truncated cone. However, the present invention is not limited to this aspect. For example, the projecting portion 91b may be shaped substantially like a truncated pyramid or may have another shape. The four corners of the thermal conductor 91 are bent to form support portions 91a projecting downward from a bottom surface of the thermal conductor 91 and each having a bottom surface abutting against the substrate 3 (if the thermal conductor 91 appears to be substantially triangular in a plan view, the three corners may be bent to form the support portions 91a).

Now, a method of manufacturing the semiconductor device 101 will be described with reference to FIGS. 3A to 3F. In FIG. 3E, reference numeral 211 denotes a molding die. Reference numeral 21t denotes an injection gate as an injection port. Reference numeral 22t denotes a direction in which a molding resin is injected.

Figure 3A:
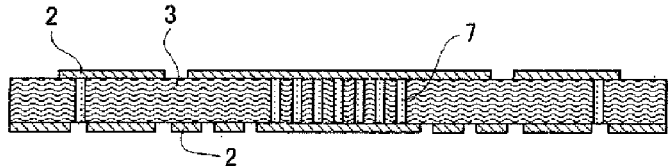
FIGS. 3A to 3F are sectional views showing a process of manufacturing the semiconductor device according to the first embodiment.
Figure 3B:
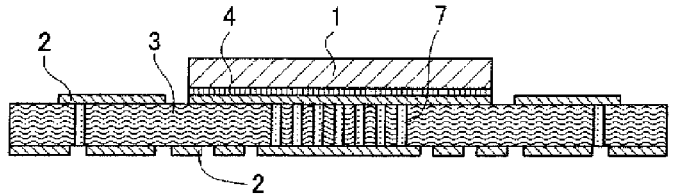

In the method of manufacturing the semiconductor device 101 according to the present embodiment, first, the substrate 3 with the wiring patterns 2 formed on both surfaces thereof is provided as shown in FIG. 3A. Then, as shown in FIG. 3B, the semiconductor element 1 is fixed and mounted on the top surface of the substrate 3 with the adhesive 4 at bonding positions. Although not shown, a plurality of the semiconductor elements 1 are provided in the vertical and horizontal directions of a plan view.

Figure 3C:
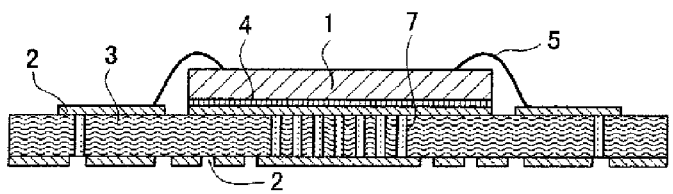

Then, as shown in FIG. 3C, electrode pads (not shown) on the semiconductor element 1 mounted on the substrate 3 are electrically connected, by the thin metal wires 5, to the wiring patterns 2, provided on the top surface of the substrate 3.

The steps described above are the same as steps of the conventional method of manufacturing the semiconductor device 100.

Figure 3D:
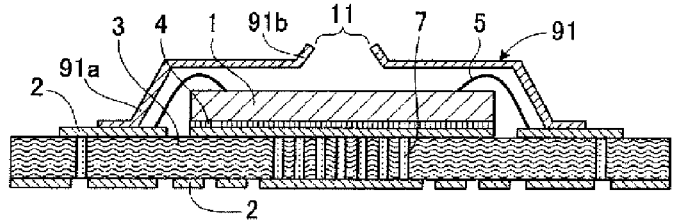
Figure 3E:
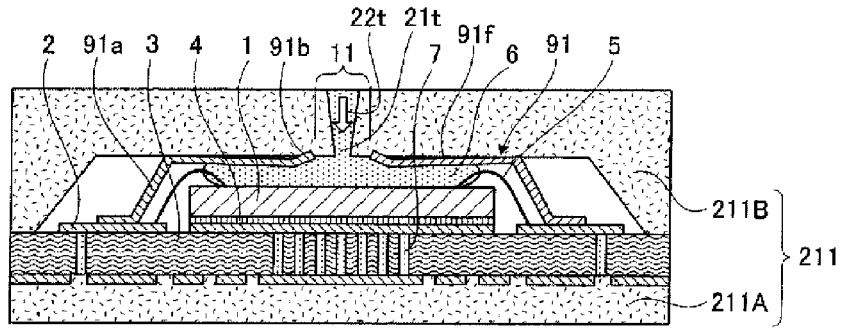

Then, as shown in FIG. 3D, the thermal conductor 91 located opposite the semiconductor element 1 is brought into abutment with the substrate 3. The thermal conductor 91 and the substrate 3 may be secured to each other at the abutting portion with the adhesive (not shown) or the like or only brought into abutment with each other without being secured to each other.

Now, a method of manufacturing the thermal conductor 91 will be described with reference to FIGS. 4A to 4E.

Figure 4A:
FIGS. 4A to 4E are sectional views showing a process of manufacturing the thermal conductor in the semiconductor device according to the first embodiment.

As shown in FIG. 4A, the thermal conductor 91 is produced by etching or pressing a metal plate made up of a material with a high thermal conductance such as Cu, Cu alloy, Al, Al alloy, or Fe—Ni alloy, into a desired integral shape.

Figure 4B:
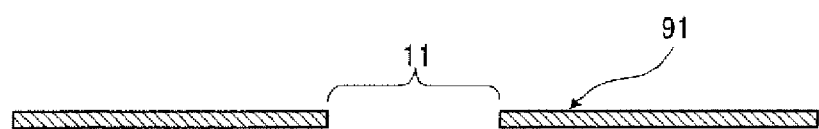

The above-described processing method is used to form the opening 11 in the center of the thermal conductor 91 so that the opening 11 penetrates the thermal conductor 91 in the board thickness direction as shown in FIG. 4B.

This structure allows the injection gate 21t to be formed vertically above the center of the major surface of the semiconductor element 1. The purpose of the structure is to enable resin injection based on the top gate scheme in order to prevent the thin metal wires 5 from being deformed by the flow of the resin during a subsequent molding step. Furthermore, the inner diameter of the opening 11 is formed to be larger than the outer diameter of the injection gate 21t to prevent thin burrs from being created around the periphery of the opening 11 during the molding step. Moreover, the surface of a part of the thermal conductor 91 which is buried in the mold resin member 6 is subjected to roughening such as dimpling so as to form recesses and protrusions. This improves the adhesion between the thermal conductor 91 and the mold resin member 6.

Figure 4C:
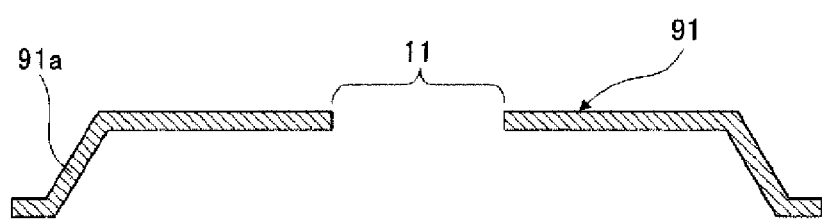

Then, as shown in FIG. 4C, the corners of the thermal conductor 91 are bent to form the support portions 91a projecting downward from the bottom surface of the thermal conductor 91. A bottom surface of each of the support portions 91a is brought into abutment with the substrate 3.

The support portions 91a of the thermal conductor 91 are present only in the corners of the thermal conductor 91 in order to allow the resin to flow smoothly during the subsequent molding step. That is, the thermal conductor 9 in the conventional semiconductor device 100 has an inclined portion close to the outer periphery thereof, whereas the thermal conductor 91 in the semiconductor device 101 according to the present embodiment does not have most of the inclined portion close to the outer periphery thereof. The thermal conductor 91 has no obstacle preventing resin injection, allowing the resin to flow smoothly in the semiconductor device 101 according to the present embodiment.

The thermal conductor 91 is located with the height of the support portions 91a adjusted so that the height between the uppermost surface of the thermal conductor 91 and the lowermost surface of the substrate 3 is larger than the depth of a cavity in the molding die 211, used during the subsequent molding step. This allows the uppermost surface of the thermal conductor 91 to constitute the exposed portion 91f exposed from the mold resin member 6 to the exterior, to improve the radiation property.

Figure 4D:
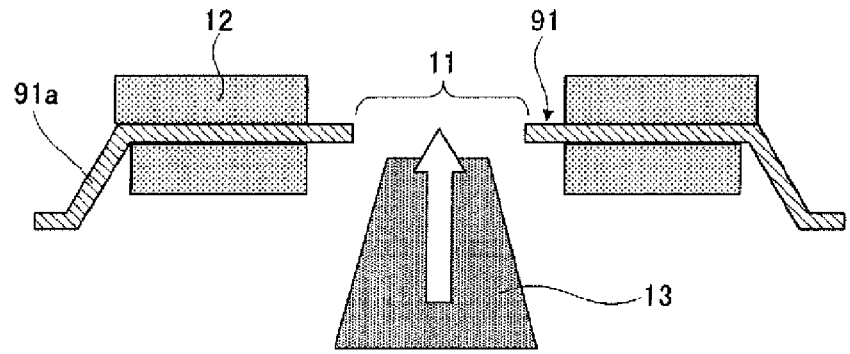
Figure 4E:
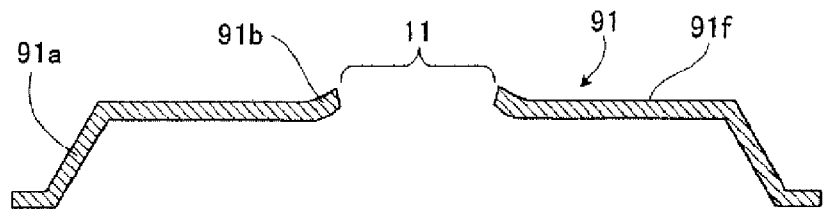

In this case, when the thermal conductor 91 contacts an upper die 211B during the subsequent molding step, if the interface between the thermal conductor 91 and the upper die 211B remains flat, the effect of the temperature or an insufficient pressure (contact pressure) on the molding die 211 may create a small gap at the periphery of the opening 11 to cause the mold resin member 6 to leak. Thus, to prevent this, the projecting portion 91b is formed by using a processing mold 12 to fix outer portions of the periphery of the opening 11 so as to sandwich the outer potions between an upper die and a lower die, while inserting and thrusting a thrusting processing mold 13 into the opening 11 in the thermal conductor 91 toward the opposite side of the mounting surface, located opposite the semiconductor element 1 as shown in FIG. 4D; the thrusting processing mold 13 has a gently inclined surface as well as a tip portion smaller than the (diameter of) opening 11 and a root portion larger than the (diameter of) opening 11. The thermal conductor 91 as shown in FIG. 4E is thus formed.

Description will be given again of the method of manufacturing the semiconductor device 101 according to the present embodiment. As shown in FIG. 3E, the semiconductor element 1 is mounted on and electrically connected to the substrate 3 by the thin metal wires 5. The thermal conductor 91 abuts against the substrate 3. The substrate 3 is set in a lower die 211A of the molding die 211 and sealed by the upper die 211B of the molding die 211. At this time, a bottom surface of the upper die 211B of the molding die 211 is in contact with the top surface of the thermal conductor 91. In particular, the projecting portion 91b of the thermal conductor 91, formed as shown in FIG. 3E, comes into contact with an inner wall surface of the upper die 211B before the outer peripheral portion of the thermal conductor 91.

In this condition, the mold resin member 6 is injected through the injection gate 21t in the injection direction 22t; the injection gate 21t is formed in the upper die 211B of the molding die 211 in the vertical direction. As a result, a space portion over the top surface of the substrate 3 is filled with the mold resin member 6, with the top surface (exposed portion 91f) of the thermal conductor 91 exposed from the mold resin member 6 to the exterior. After the mold resin member 6 is cured, the upper die 211B and lower die 211A of the molding die 211 are opened to form the assembly of the semiconductor device molded by the mold resin member 6.

Figure 3F:
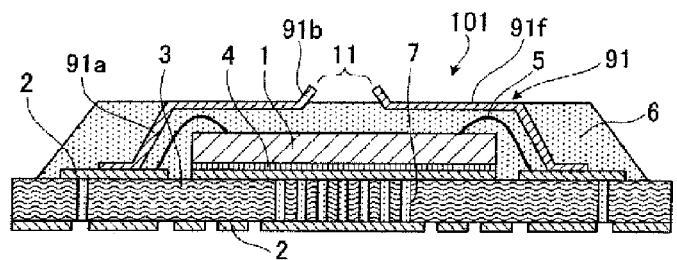

Then, as shown in FIG. 3F, the substrate 3 with the top surface (semiconductor element mounting surface) molded by the mold resin member 6 is cut into semiconductor chips using a rotating blade (not shown).

Finally, solder balls are attached to external pad electrodes (electrode terminals) on a bottom surface of each of the semiconductor chips, into which the substrate 3 has been cut, to form the ball electrodes 8, which constitute external terminals. The semiconductor device 101 as shown in FIG. 1 can thus be manufactured.

The thermal conductor 91 need not be shaped like a quadrilateral (a rectangle in a plan view) as in the case of the present embodiment but may be round or polygonal. The shape of the opening 11 also need not be round but may be polygonal provided that the opening 11 is larger than the outer diameter of the injection gate. Furthermore, the support portions 91a of the thermal conductor 91 need not necessarily abut against the substrate 3 but may abut against the semiconductor element 1 provided that the support portions 91a allows the top surface of the thermal conductor 91 to be exposed. Moreover, the support portions 91a need not be produced by bending the corners of the thermal conductor 91. Other members may be bonded to the corners of the thermal conductor 91 as support portions provided that the support portions allow the top surface of the thermal conductor 91 to be exposed to form the exposed portion 91f.

Description will be given of effects of the semiconductor device 101 and the method of manufacturing the semiconductor device 101 according to the present embodiment.

As described above, in addition to the substrate 3, thin metal wires 5, semiconductor element 1, and mold resin member 6, which are provided in the conventional semiconductor device, the semiconductor device 101 according to the present embodiment comprises the thermal conductor 91 made up of the thermally conductive material and having the exposed portion 91f corresponding to the top surface thereof and exposed from the mold resin member 6 to the exterior, and the opening 11 formed in the exposed portion 91f and penetrating the thermal conductor 91 in the board thickness direction. This enables the resin to be injected through the opening 11 while maintaining the conventional function of emitting heat generated in the semiconductor device 101 to the exterior of the semiconductor device 101 via the exposed portion 91f of the thermal conductor 91. The opening 11 formed in the exposed portion 91f of the thermal conductor 91 improves the adhesion between the thermal conductor 91 and the mold resin member 6.

The semiconductor device 101 allows the top gate scheme according to which the injection gate 21t is formed above the opening 11 in the thermal conductor 91, to be adopted for the molding step of the manufacturing process. This reduces the amount by which the thin metal wires 5 are deformed by the flow of the resin. That is, the thin metal wires 5 can be prevented from being short-circuited. The method of manufacturing the semiconductor device 101 according to the present invention enables the semiconductor device 101 to be manufactured while preventing the electric connection function from being degraded or disabled. The semiconductor device 101 can be manufactured at a high yield.

Furthermore, the inner diameter of the opening 11 in the thermal conductor 91 in the semiconductor device 101 is formed to be larger than the outer diameter of the injection gate 21t, and the projecting portion 91b is formed around the periphery of the opening 11 so as to project toward the opposite side of the semiconductor element 1 mounting surface. This makes it possible to prevent thin burrs from being created around the periphery of the opening 11 during the molding step. That is, if the inner diameter of the opening 11 in the thermal conductor 91 in the semiconductor device 101 is formed smaller than the outer diameter of the injection gate 21t, the molding resin may advance between the periphery of the opening 11 in the thermal conductor 91 and the top surface of the upper die 211B of the molding die 211 to create thin burrs. However, the above-described configuration makes this problem unlikely to occur. Moreover, since the projecting portion 91b is formed around the periphery of the opening 11 in the thermal conductor 91, when the upper die 211B and lower die 211A of the molding die 211 are closed and clamped, the projecting portion 91b of the thermal conductor 91 is pressed hard against the planar bottom surface (inner wall surface) of the upper die 211B. Then, the molding step is executed in this condition, reliably preventing the molding resin from advancing between the periphery of the opening 11 in the thermal conductor 91 and the top surface of the upper die 211B of the molding die 211. This makes it possible to reliably prevent thin burrs from being created around the periphery of the opening 11 during the molding step.

In the semiconductor device 101 the support portions 91a are provided only in the corners of the bottom surface of the thermal conductor 91. This prevents the thermal conductor 91 from obstructing the flow of the resin during the molding step. Defects such as incomplete filling of the resin can be prevented.

Moreover, in the semiconductor device 101, the support portions 91a of the thermal conductor 91 are provided only in the corners to reduce the abutting area between the thermal conductor 91 and the substrate 3. This prevents the thermal conductor 91 from obstructing the wiring patterns 2 for signals. This makes the thermal conductor 91 composed of an electrically conductive material available though grounding. A high frequency property can thus be improved.

In short, with the semiconductor device 101 and the method of manufacturing the semiconductor device 101 according to the present embodiment, the semiconductor device 101 according to the present embodiment is more excellent than the conventional semiconductor device 100. That is, the semiconductor device 101 exhibits a higher performance by, for example, reducing the deformation amount of the thin metal wires 5 during the molding step to prevent defects resulting from the possible short-circuiting between the thin metal wires 5, allowing the resin to flow smoothly to prevent the possible incomplete filling of the resin, and achieving appropriate adhesion to the mold resin member 6, offers a high manufacturing yield, and improves the high frequency property by using the grounded thermal conductor 91. Moreover, the present embodiment makes it possible to reliably prevent thin burrs from being created around the periphery of the opening 11, allowing the semiconductor device 101 with a stable quality to be manufactured.

The shape of the thermal conductor 91 is not limited to the one in the first embodiment.

Second Embodiment

A second embodiment as a variation of the first embodiment will be described below with reference to FIG. 5 and other figures. The only difference between the semiconductor device 101 according to the first embodiment and a semiconductor device 102 according to the second embodiment, a variation of the semiconductor device 101, is the shapes of a thermal conductor 92 and the molding die 211. In the description below, components of the semiconductor device 102 corresponding to components of the semiconductor device 101 according to the first embodiment are denoted by the same reference numerals. The description of these components is omitted.

Figure 5:
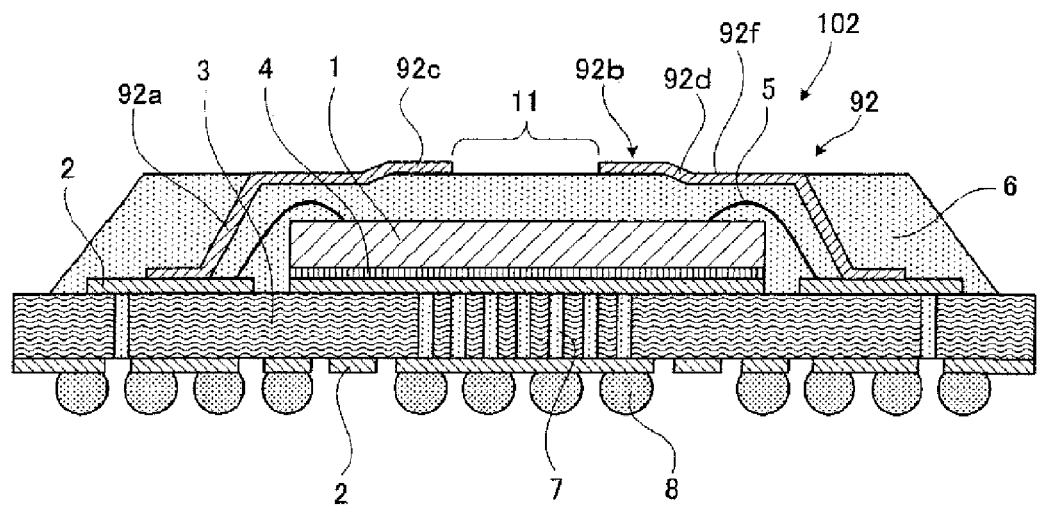
FIG. 5 is a sectional view of a semiconductor device according to a second embodiment of the present invention.
Figure 6:
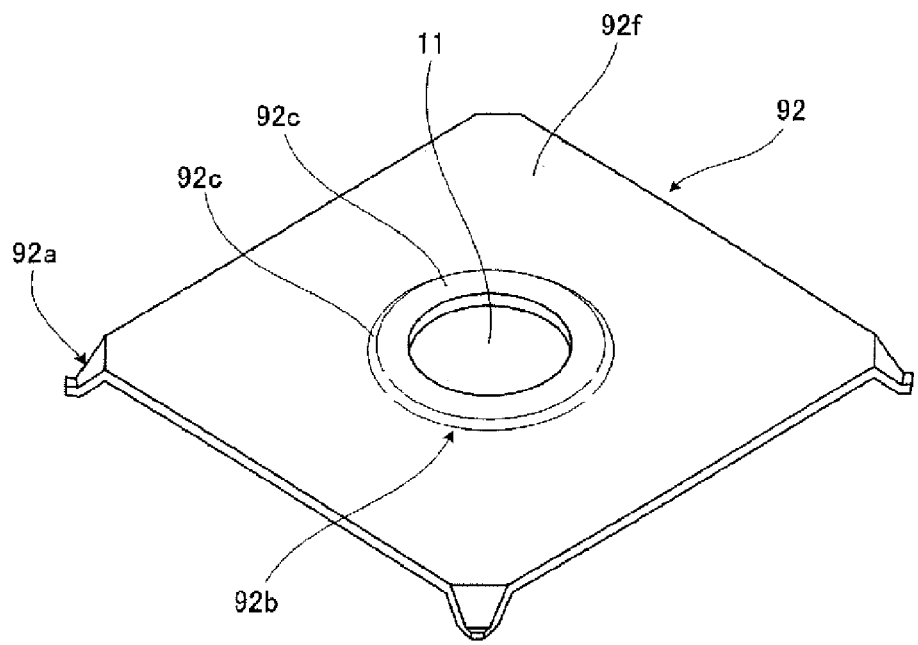
FIG. 6 is a perspective view of a thermal conductor in the semiconductor device according to the second embodiment.

FIG. 5 is a sectional view showing the semiconductor device 102 according to the second embodiment of the present invention. FIG. 6 is a perspective view of the thermal conductor 92 in the semiconductor device 102.

The thermal conductor 92, provided in the semiconductor device 102 according to the second embodiment, has a projecting portion 92b formed around the periphery of the opening 11 and projecting toward the opposite side of a surface of the thermal conductor 92 which is opposite the major surface of the semiconductor element 1, the projecting portion 92b comprising a flat portion 92c positioned above an exposed portion 92f located around the periphery of the projecting portion 92b, as shown in FIG. 5. The area of a part of the flat portion 92c in which the projecting portion 92b of the thermal conductor 92 is provided is smaller than that of the exposed portion 92f, located around the periphery of the projecting portion. In the other respects, the semiconductor device 102 is the same as the semiconductor device 101 according to the first embodiment.

Similar effects can also be exerted by bringing the flat portion 92c of the projecting portion 92b into abutment with an upper die 212B of a molding die 212 during the resin molding step. The width of the flat portion 92c is as small as possible.

Several methods are available for forming (manufacturing) the thermal conductor 92 in the semiconductor device 102 according to the second embodiment. The methods will be sequentially described below with reference to FIGS. 7A to 10E.

FIGS. 7A to 7E are sectional views showing a first method for manufacturing the semiconductor device 102.

Figure 7A:
FIGS. 7A to 7E are sectional views showing a first method of manufacturing the thermal conductor in the semiconductor device according to the second embodiment.

As shown in FIG. 7A, the thermal conductor 92 is produced by etching or pressing a metal plate made up of a material with a high thermal conductance such as Cu, Cu alloy, Al, Al alloy, or Fe—Ni alloy, into a desired shape.

Figure 7B:
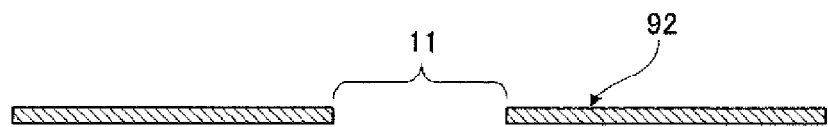

The above-described processing method is used to form the opening 11 in the center of the thermal conductor 92 so that the opening 11 penetrates the thermal conductor 92 in the board thickness direction as shown in FIG. 7B.

This structure allows the injection gate 21t (see FIG. 3E) to be formed vertically above the center of the major surface of the semiconductor element 1. The purpose of the structure is to enable resin injection based on the top gate scheme in order to prevent the thin metal wires 5 from being deformed by the flow of the resin during the subsequent molding step. Furthermore, the inner diameter of the opening 11 is formed to be larger than the outer diameter of the injection gate 21t to prevent thin burrs from being created around the periphery of the opening 11 during the molding step. Moreover, the surface of a part of the thermal conductor 92 which is buried in the mold resin member 6 is subjected to roughening such as dimpling so as to form recesses and protrusions. This improves the adhesion between the thermal conductor 92 and the mold resin member 6.

Figure 7C:
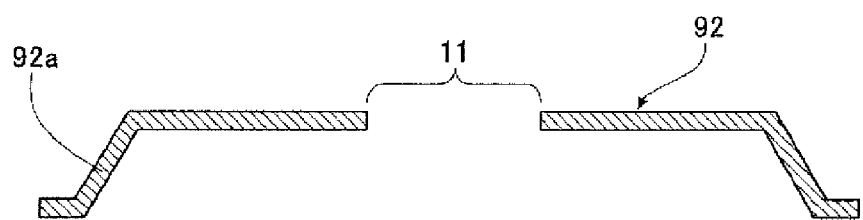

Then, as shown in FIG. 7C, the corners of the thermal conductor 92 are bent to form the support portions 92a projecting downward from the bottom surface of the thermal conductor 92. A bottom surface of each of the support portions 92a is brought into abutment with the substrate 3.

The support portions 92a of the thermal conductor 92 are present only in the corners of the thermal conductor 92 in order to allow the resin to flow smoothly during the subsequent molding step. That is, the thermal conductor 9 in the conventional semiconductor device 100 has an inclined portion close to the outer periphery thereof, whereas the thermal conductor 92 in the semiconductor device 102 according to the present embodiment does not have most of the inclined portion close to the outer periphery thereof. The thermal conductor 92 has no obstacle preventing resin injection, allowing the resin to flow smoothly in the semiconductor device 102 according to the present embodiment.

The thermal conductor 92 is located with the height of the support portions 92a adjusted so that the height between the uppermost surface (exposed portion 92f) of the thermal conductor 92 and the lowermost surface of the substrate 3 is larger than the depth of the cavity in the molding die 211, used during the subsequent molding step. This allows the uppermost surface of the thermal conductor 92 to be exposed from the mold resin member 6 to the exterior to improve the radiation property.

Figure 7D:
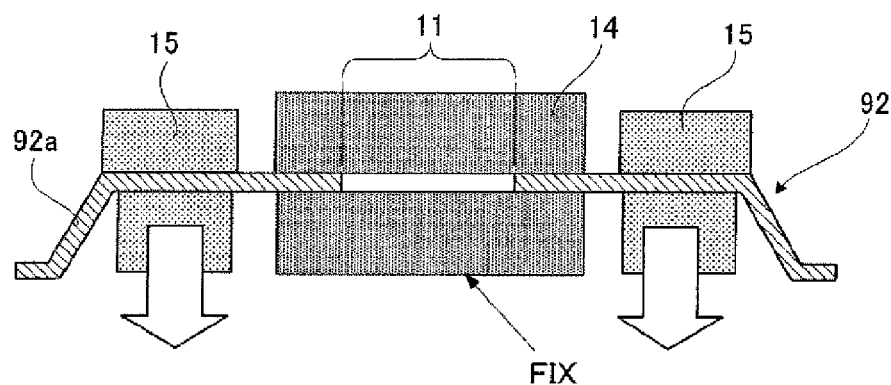
Figure 7E:
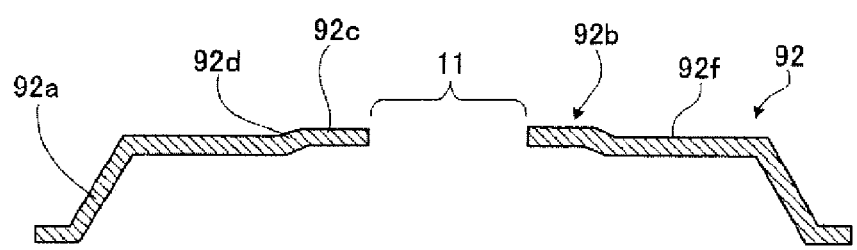
Figure 8A:
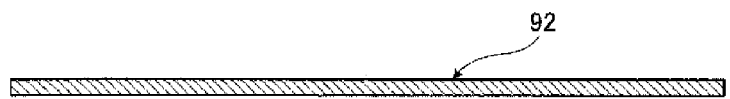
FIGS. 8A to 8E are sectional views showing a second method of manufacturing the thermal conductor in the semiconductor device according to the second embodiment.
Figure 8B:
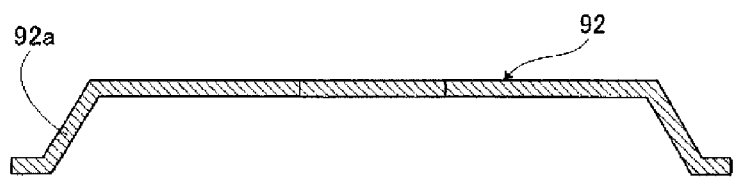
Figure 8C:
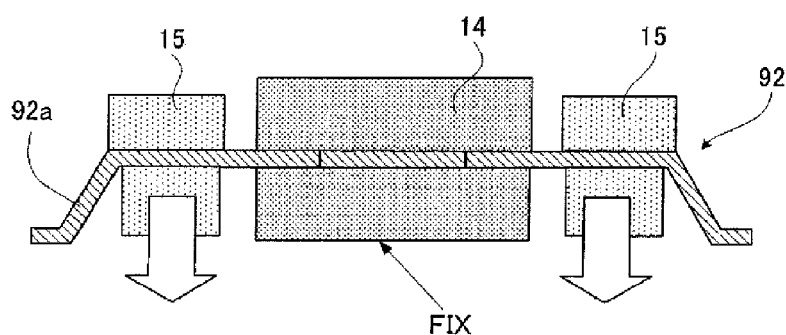
Figure 8D:
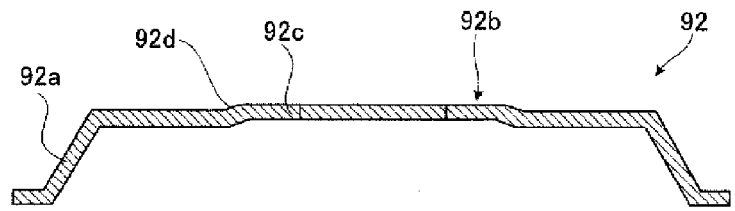
Figure 8E:
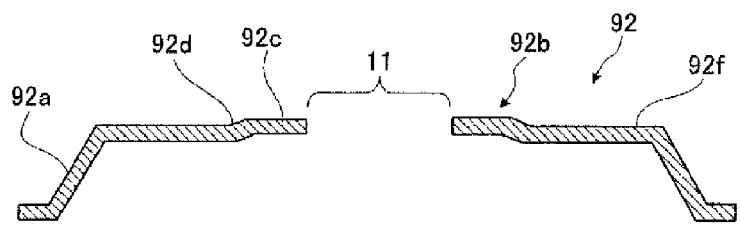

In this case, when the thermal conductor 92 contacts the upper die 211B during the subsequent molding step, if the interface between the thermal conductor 92 and the upper die 211B remains flat, the effect of the temperature or an insufficient pressure (contact pressure) on the molding die 211 may create a small gap at the periphery of the opening 11 to cause the mold resin member 6 to leak. Thus, to prevent this, the following method is used to form the projecting portion 92b projecting toward the opposite side of the surface of the thermal conductor 92 which is opposite the semiconductor element 1 when the semiconductor device 102 is finally formed: as shown in FIG. 7D, a processing mold 14 is used to sandwich the periphery of the opening 11 between an upper die and a lower die, a processing mold 15 is used to sandwich the periphery of the projecting portion 92b between an upper die and a lower die, the processing mold 14 is fixed, and the processing mold 15 is moved toward the area in which the semiconductor element 1 and the substrate 3 are finally disposed (downward relative to the processing mold 14). The thermal conductor 92 as shown in FIG. 7E is thus formed FIGS. 8A to 8E are sectional views showing a second method of manufacturing the thermal conductor 92 in the semiconductor device 102 according to the second embodiment of the present invention.

In the first manufacturing method, shown in FIGS. 7A to 7E, the opening 11 is formed before the projecting portion 92b is formed. However, the second manufacturing method, shown in FIGS. 8A to 8E, is characterized in that the opening 11 is formed after the projecting portion 92b has been formed. In the other respects, the second manufacturing method is the same as the first manufacturing method.

FIGS. 9A to 9E are sectional views showing a third method of manufacturing the thermal conductor 92 in the semiconductor device 102.

Figure 9A:
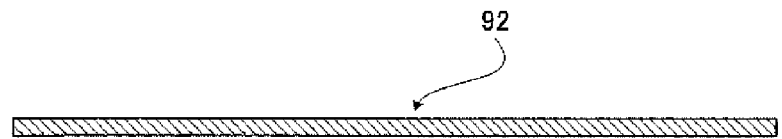
FIGS. 9A to 9E are sectional views showing a third method of manufacturing the thermal conductor in the semiconductor device according to the second embodiment.
Figure 9B:
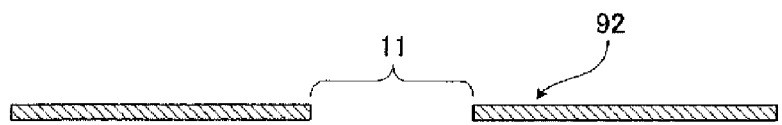
Figure 9C:
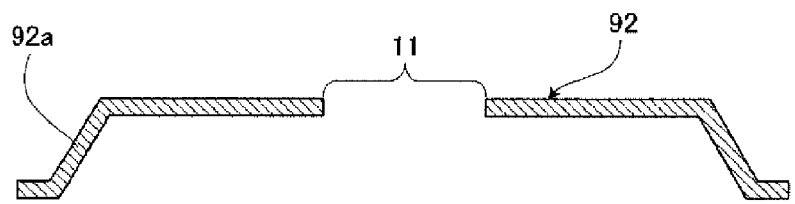
Figure 9D:
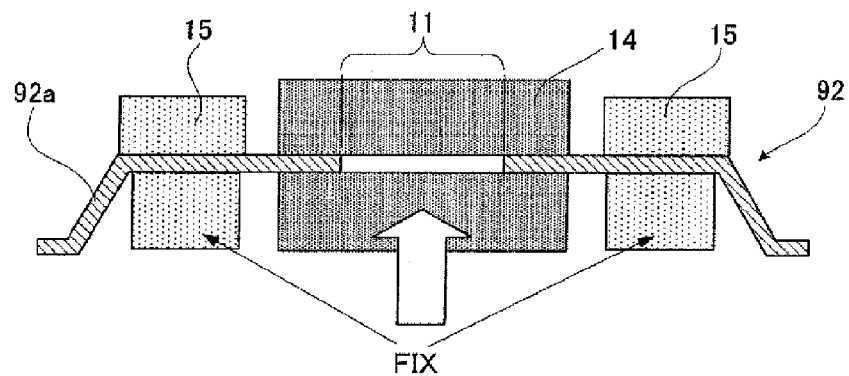
Figure 9E:
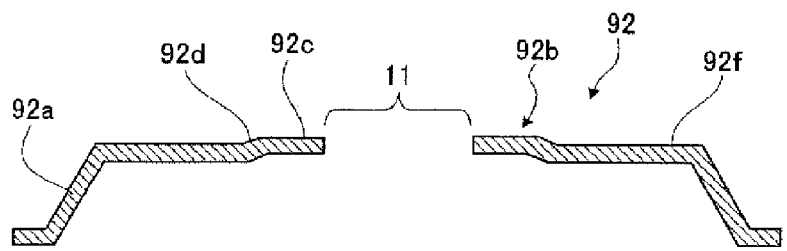
Figure 10A:
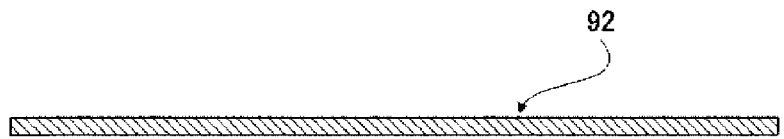
FIGS. 10A to 10E are sectional views showing a fourth method of manufacturing the thermal conductor in the semiconductor device according to the second embodiment.
Figure 10B:
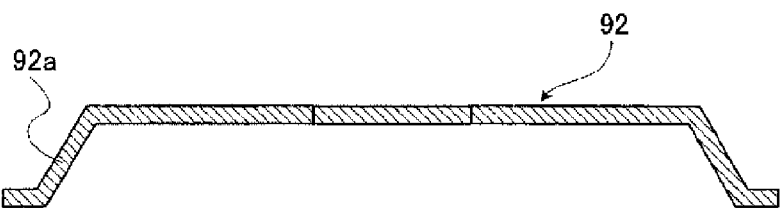
Figure 10C:
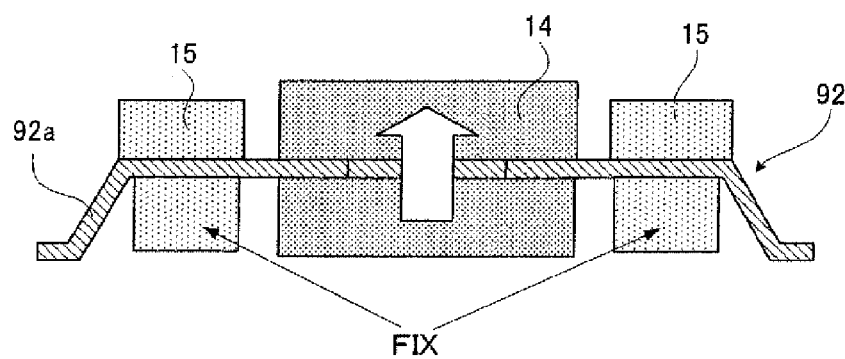
Figure 10D:
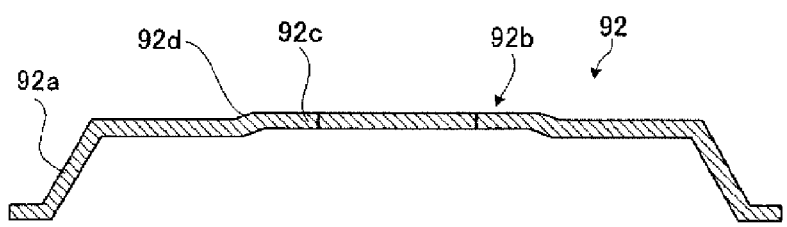
Figure 10E:
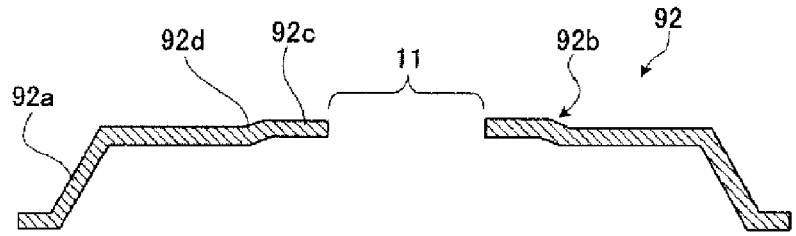

The third manufacturing method which is different from the first and second manufacturing methods, shown in FIGS. 9A to 9E, is characterized in that the thermal conductor 92 as shown in FIG. 9E is formed by forming the projecting portion 92b by using the processing mold 14 to sandwich the periphery of the opening 11 between the upper die and the lower die, using the processing mold 15 to sandwich the periphery of the projecting portion 92b between the upper die and the lower die, fixing the processing mold 15, and moving the processing mold 14 toward the opposite side of the surface of the thermal conductor 92 which is opposite the semiconductor element 1. In the other respects, the third manufacturing method is the same as the first manufacturing method.

FIGS. 10A to 10E are sectional views showing a fourth method of manufacturing the thermal conductor 92 in the semiconductor device 102.

The fourth manufacturing method, shown in FIGS. 10A to 10E, is characterized in that the opening 11 is formed after the projecting portion 92b has been formed. In the other respects, the fourth manufacturing method is the same as the first manufacturing method.

The semiconductor device 102 according to the second embodiment also allows the top gate scheme according to which the injection gate 21t is formed above the opening 11 in the thermal conductor 92, to be adopted for the molding step of the manufacturing process. This reduces the amount by which the thin metal wires 5 are deformed by the flow of the resin. That is, the thin metal wires 5 can be prevented from being short-circuited. The semiconductor device 102 can be manufactured at a high yield.

The projecting portion 92b, projecting toward the opposite side of the semiconductor element 1 mounting surface, more specifically, the flat portion 92c of the projecting portion 92b, positioned above the periphery of the projecting portion 92b, is formed around the periphery of the opening 11 in the thermal conductor 92 in the semiconductor device 102. Thus, when the upper die 211B and lower die 211A of the molding die 211 are closed, the flat portion 92c of the projecting portion 92b of the thermal conductor 92 is pressed hard against the planar bottom surface of the upper die 211B. Then, the molding step is executed in this condition, reliably preventing the molding resin from advancing between the periphery of the opening 11 in the thermal conductor 92 and the top surface of the upper die 211B of the molding die 211. This makes it possible to reliably prevent thin burrs from being created around the periphery of the opening 11 during the molding step.

In the semiconductor device 102, the support portions 92a of the thermal conductor 92 are also provided only in the corners. This reduces the abutting area between the thermal conductor 92 and the substrate 3 and prevents the thermal conductor 92 from obstructing the wiring patterns 2 for signals This makes the thermal conductor 92 composed of an electrically conductive material available though grounding. The high frequency property can thus be improved.

In short, with the semiconductor device 102 and the method of manufacturing the semiconductor device 102 according to the second embodiment, the semiconductor device 102 according to the present embodiment is also more excellent than the conventional semiconductor device 100. That is, the semiconductor device 102 exhibits a higher performance by, for example, reducing the deformation amount of the thin metal wires 5 during the molding step to prevent defects resulting from the possible short-circuiting between the thin metal wires 5, allowing the resin to flow smoothly to prevent the possible incomplete filling of the resin, and achieving appropriate adhesion to the mold resin member 6, offers a high manufacturing yield, and improves the high frequency property by using the grounded thermal conductor 92. Moreover, the present embodiment makes it possible to reliably prevent thin burrs from being created around the periphery of the opening 11.

Third Embodiment

Figure 11A:
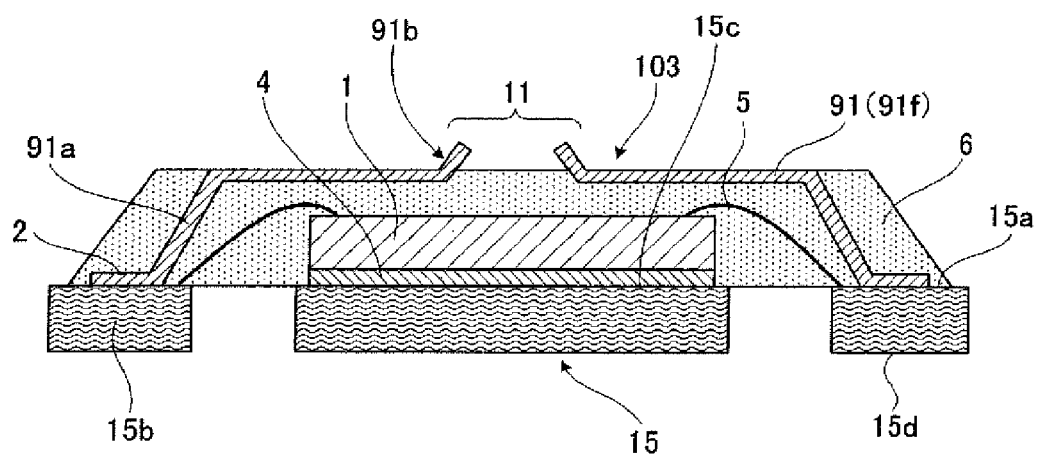
FIGS. 11A and 11B are a sectional view and a bottom view of a semiconductor device according to a third embodiment of the present invention.
Figure 11B:
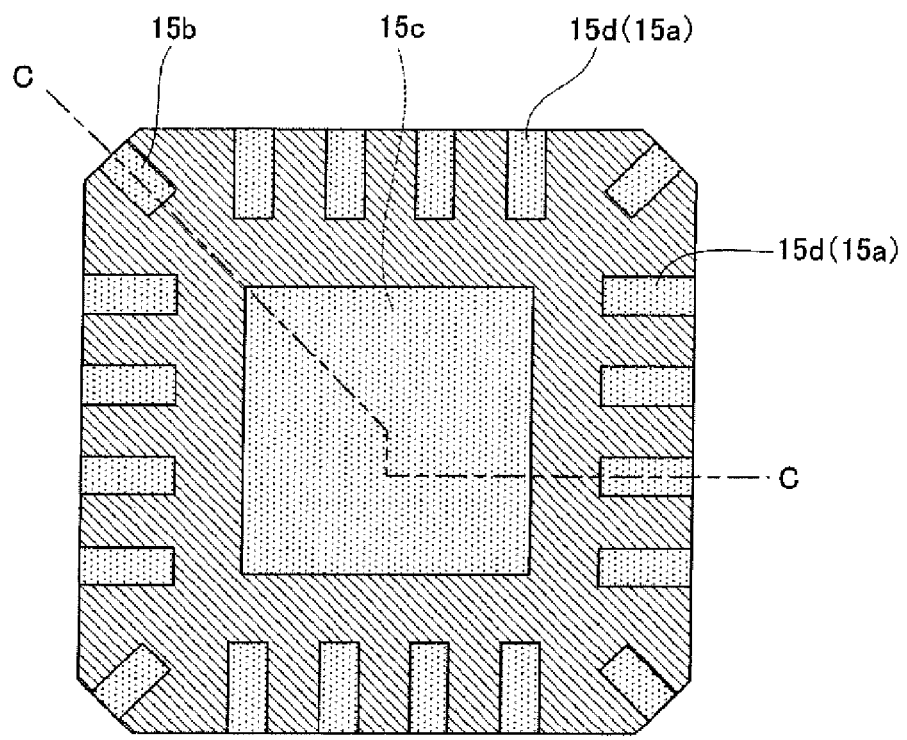
Figure 12:
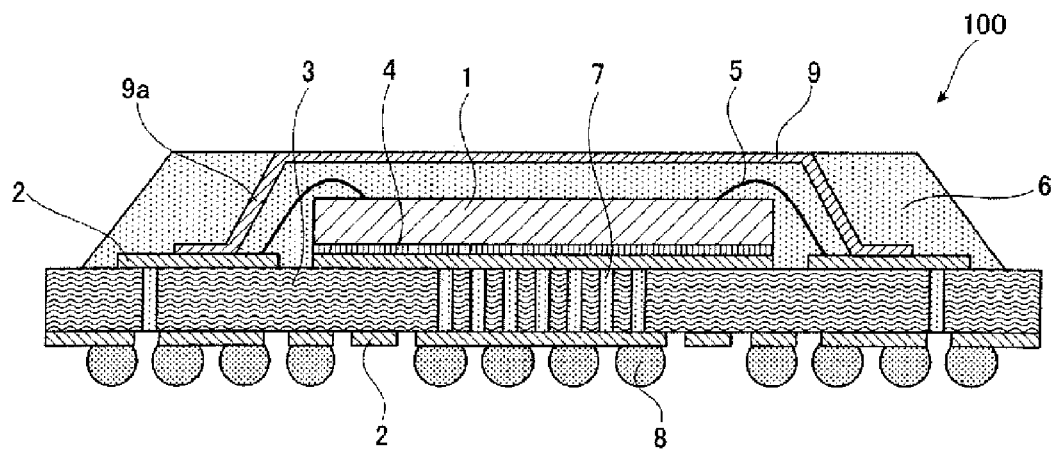
FIG. 12 is a sectional view of a conventional semiconductor device.
Figure 13:
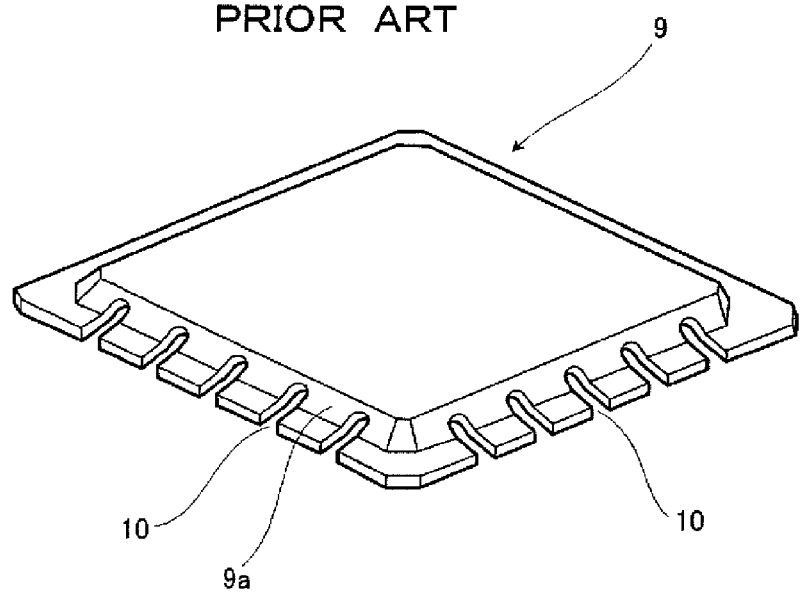
FIG. 13 is a perspective view of a thermal conductor in the conventional semiconductor device.
Figure 14A:
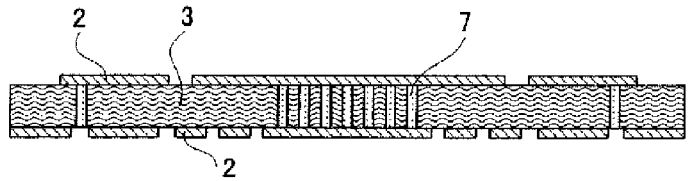
FIGS. 14A to 14F are sectional views showing a process of manufacturing the conventional semiconductor device.
Figure 14B:
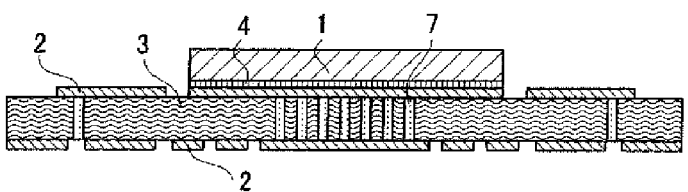
Figure 14C:
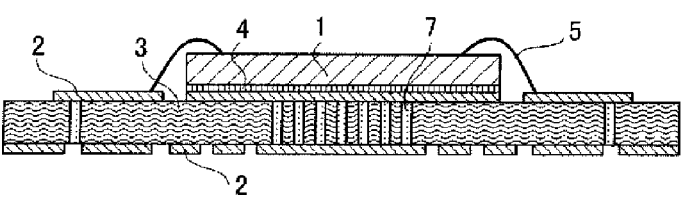
Figure 14D:
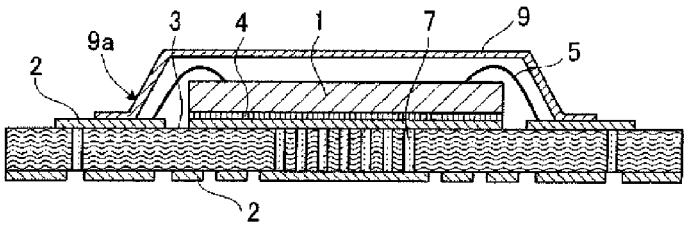
Figure 14E:
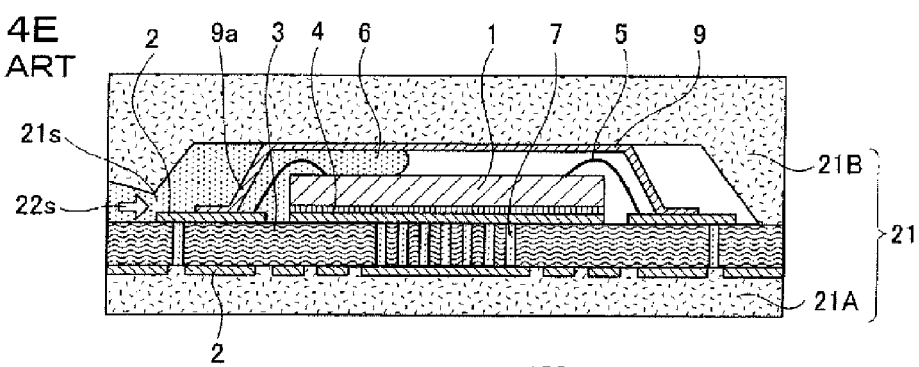
Figure 14F:
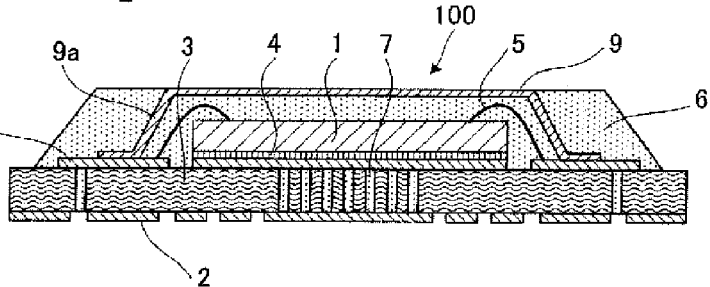
Figure 15A:
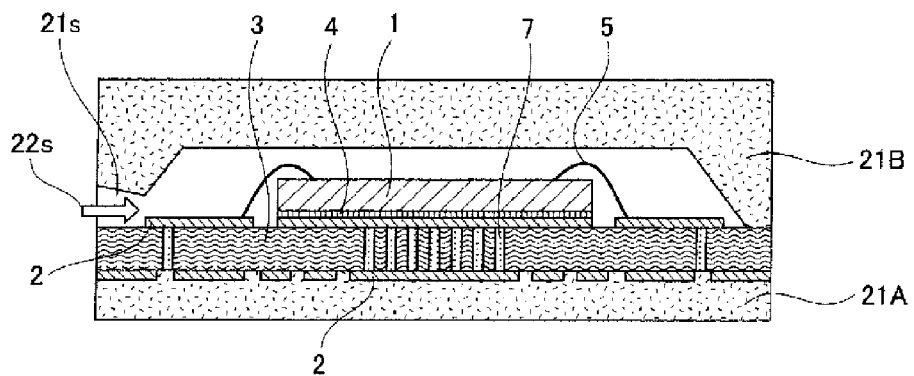
Figure 15B:
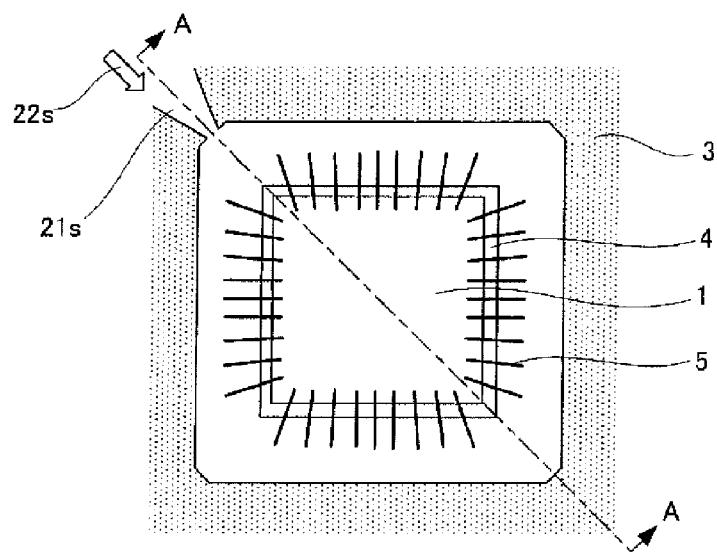
Figure 15C:
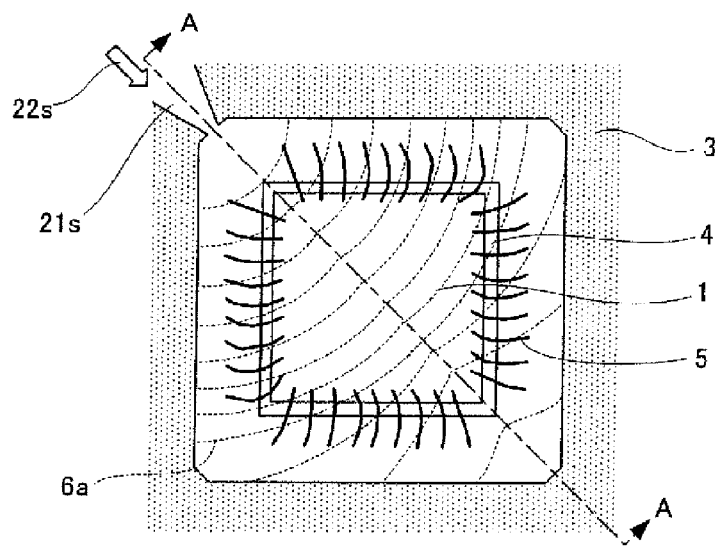
Figure 16A:
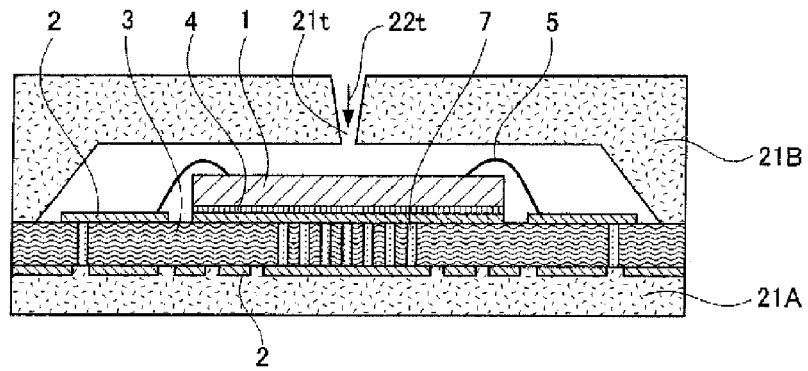
Figure 16B:
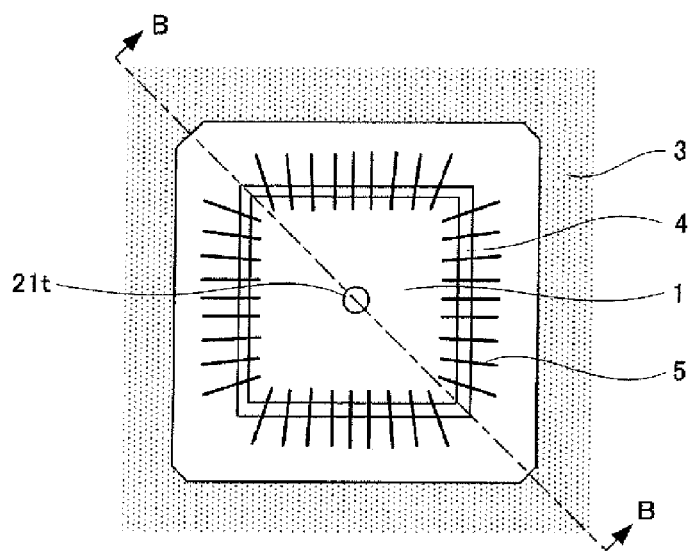
Figure 16C:
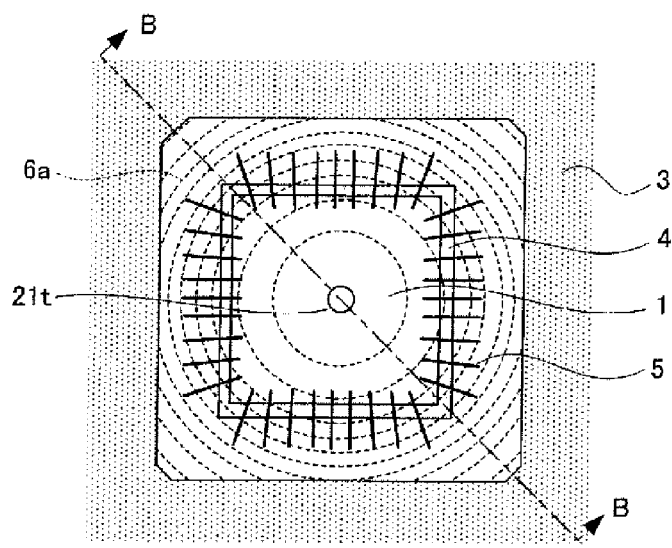

FIGS. 11A and 11B show a sectional view and a bottom view of a semiconductor device 103 according to a third embodiment of the present invention. FIG. 11A corresponds to a sectional view take along an alternate long and short dash line C-C shown in FIG. 11B. In the description below, components of the semiconductor device 103 corresponding to components of the semiconductor device 101 according to the first embodiment are denoted by the same reference numerals. The description of these components is omitted.

As shown in FIGS. 11A and 11B, the semiconductor device 103 according to the third embodiment comprises, instead of the substrate 3 according to the first embodiment, a lead frame 15 integrally having a die pad 15c corresponding to a semiconductor element mounting area, a plurality of leads arranged around the die pad 15c and each having a bottom surface constituting an external terminal 15d and a top surface constituting an internal terminal 15*a*, and hanging leads 15*b* that support the die pad 15*c*.

The major surface of the semiconductor element 1 is secured to the die pad 15*c* of the lead frame 15 with the adhesive 4. The electrodes on the semiconductor element 1 are electrically connected to the top-surface internal terminals 15*a* on the lead frame 15 by the thin metal wires 5. The support portions 91*a* of the thermal conductor 91 are secured to the hanging leads 15*b*, arranged in the four corners of the semiconductor device. The mold resin member 6 covers the semiconductor element 1, the thin metal wires 5, the semiconductor element side and support portions 91*a* of the thermal conductor 91, and the top-surface internal terminals 15*a* with the resin. In this case, the mold resin member 6 is provided so as to expose the top surface of the thermal conductor 91, a bottom surface of the die pad 15*c*, and the external terminals 15*d* which is the lower surface of the lead to the exterior.

Furthermore, the thermal conductor 91 is disposed so that the surface of the thermal conductor 91 which is opposite the surface thereof located opposite the major surface of the semiconductor element 1, that is, the top surface of the thermal conductor 91 is exposed to the exterior. The opening 11 is formed in a part of the top surface of thermal conductor 91, which is exposed to the exterior, so as to penetrate the thermal conductor 91 in the board thickness direction. Moreover, the projecting portion 91*b* is provided around the periphery of the opening 11 so as to project toward the opposite side of the area in which the semiconductor element 1 is disposed, that is, from the exposed portion 91*f* toward the opposite side of the surface of the thermal conductor 91 which is opposite the major surface of the semiconductor element 1.

This configuration can achieve operations and effects which are similar to operations and effects of the first embodiment.

The present invention is particularly suitably applicable to a semiconductor device in which a semiconductor element generating a large quantity of heat is suitably mounted, and a method of manufacturing the semiconductor device. The present invention is effective for implementing a semiconductor device which exhibits a particularly excellent radiation property and which is requested to have a stable quality.

What is claimed is:

1. A semiconductor device comprising:
   a semiconductor element;
   a thermal conductor located opposite a first surface of the semiconductor element; and
   a mold resin member molding the semiconductor element and a part of the thermal conductor,
   wherein at least a part of a top surface of the thermal conductor has an exposed portion exposed from the mold resin member,
   the exposed portion of the thermal conductor has an opening, and
   a projecting portion projecting away from the semiconductor element is formed at an edge of the opening,
   a top part of the projecting portion is higher than the surface of the mold resin exposed in the opening, and
   the top of the projecting portion is higher than the top surface of the thermal conductor.

2. The semiconductor device according to claim 1, further comprising a substrate having a plurality of electrode terminals on a bottom surface,
   wherein the thermal conductor is located opposite the first surface of the semiconductor element fixed to a top surface of the substrate.

3. The semiconductor device according to claim 2, wherein the thermal conductor is supported by a support portion fixed on the substrate.

4. The semiconductor device according to claim 3, wherein the support portion is formed by bending a part of the thermal conductor.

5. The semiconductor device according to claim 2, further comprising a plurality of thin metal wires electrically connecting the substrate and the semiconductor element together.

6. The semiconductor device according to claim 1, further comprising a die pad and a plurality of leads arranged around a periphery of the die pad and each having a bottom surface forming an external terminal and a top surface forming an internal terminal,
   wherein the thermal conductor is located opposite the first surface of the semiconductor element fixed on the die pad.

7. The semiconductor device according to claim 6, wherein the thermal conductor is supported by a support portion fixed on a hanging lead connected to the die pad.

8. The semiconductor device according to claim 7, wherein the support portion is formed by bending a part of the thermal conductor.

9. The semiconductor device according to claim 6, further comprising a plurality of thin metal wires electrically connecting the lead and the semiconductor element together.

10. The semiconductor device according to claim 1, wherein the projecting portion of the thermal conductor is formed integrally with the other portions of the thermal conductor.

11. The semiconductor device according to claim 1, wherein a part of the projecting portion of the thermal conductor is flush with a plane substantially parallel to the other exposed portion of the thermal conductor.

12. The semiconductor device according to claim 1, wherein a part of the thermal conductor which is buried in the mold resin member has a roughened surface.

13. The semiconductor device according to claim 1, wherein the thermal conductor is connected to a ground terminal.

14. A method of manufacturing a semiconductor device, the method comprising the steps of:
    providing a thermal conductor having an opening in the top surface of the thermal conductor and a projecting portion provided around an edge of the opening and projecting upward from a top surface of the thermal conductor;
    mounting the thermal conductor so that a surface of the thermal conductor which is opposite a surface thereof from which the projecting portion projects is located opposite a first surface of a semiconductor element;
    installing a molding die so that the projecting portion abuts against an inner wall of the molding die; and
    injecting resin into the molding die through an injection port formed in the molding die and through the opening to mold the semiconductor element and the thermal conductor so as to expose the projecting portion wherein the top part of the projecting portion is higher than the surface of the mold resin exposed in the opening.

15. The method of manufacturing the semiconductor device according to claim 14, wherein the opening in the thermal conductor is formed so as to have a diameter larger than a diameter of the injection port in the molding die, and during resin injection, a circumference of the projecting portion formed around the edge of the opening in the thermal conductor entirely contacts an inner wall portion of the molding die which is located outside a periphery of the injection port.

16. The method of manufacturing the semiconductor device according to claim 14, wherein in the step of manufacturing the thermal conductor, a cylindrical mold having a tip portion smaller than the opening in the thermal conductor and a root portion larger than the opening is inserted into the opening in the thermal conductor to bend the edge of the opening in the thermal conductor to form the projecting portion.

17. The method of manufacturing the semiconductor device according to claim 14, wherein in the step of manufacturing the thermal conductor, the projecting portion is formed around the edge of the opening in the thermal conductor by using a first die to support the edge of the opening in the thermal conductor, using a second die to support a part of the thermal conductor which is located outside the periphery of the opening, and moving the second die along a thickness direction of the thermal conductor relative to the first die.

18. The method of manufacturing the semiconductor device according to claim 14, wherein in the step of manufacturing the thermal conductor, the projecting portion is formed, and the opening is then formed in a center of the projecting portion.

19. The method of manufacturing the semiconductor device according to claim 14, wherein in the step of manufacturing the thermal conductor, the projecting portion is formed by pressing using a mold projecting the edge of the opening in the thermal conductor.

20. The method of manufacturing the semiconductor device according to claim 14, wherein in the step of manufacturing the thermal conductor, the projecting portion is formed by pressing using a mold projecting a center of the thermal conductor, and the opening is then formed in a center of the projecting portion.

* * * * *